(12) United States Patent
Wen (10) Patent No.: US 8,766,689 B2
(45) Date of Patent: Jul. 1, 2014

(54) PHASE-FREQUENCY DETECTION METHOD

(75) Inventor: Steven Wen, Beijing (CN)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 0 days.

(21) Appl. No.: 13/976,943

(22) PCT Filed: Dec. 29, 2010

(86) PCT No.: PCT/CN2010/002190
§ 371 (c)(1),
(2), (4) Date: Jun. 27, 2013

(87) PCT Pub. No.: WO2012/088625
PCT Pub. Date: Jul. 5, 2012

(65) Prior Publication Data
US 2013/0278311 A1    Oct. 24, 2013

(51) Int. Cl.
*H03L 7/06*    (2006.01)
(52) U.S. Cl.
USPC .......................................... 327/158; 327/149
(58) Field of Classification Search
USPC ................................................. 327/149, 158
See application file for complete search history.

(56) References Cited

U.S. PATENT DOCUMENTS

| 4,577,163 | A | * | 3/1986 | Culp | 331/1 A |
| 5,896,428 | A | * | 4/1999 | Yanagiuchi | 375/374 |
| 5,945,856 | A | * | 8/1999 | Yanagiuchi | 327/159 |
| 6,064,244 | A | * | 5/2000 | Wakayama et al. | 327/158 |
| 7,496,781 | B2 | * | 2/2009 | Tamura et al. | 713/600 |
| 7,551,037 | B2 | * | 6/2009 | Isobe et al. | 331/16 |
| 8,058,916 | B2 | * | 11/2011 | Steiner | 327/156 |
| 8,536,910 | B2 | * | 9/2013 | Nagaraj et al. | 327/156 |
| 2009/0251226 | A1 | | 10/2009 | Kathuria et al. | |
| 2009/0284318 | A1 | | 11/2009 | Machado | |
| 2010/0134163 | A1 | * | 6/2010 | Kawamoto | 327/157 |
| 2011/0254602 | A1 | * | 10/2011 | Steiner | 327/158 |
| 2012/0319734 | A1 | * | 12/2012 | Nagaraj et al. | 327/3 |
| 2013/0076414 | A1 | * | 3/2013 | Kato | 327/157 |
| 2013/0278311 | A1 | * | 10/2013 | Wen | 327/159 |

FOREIGN PATENT DOCUMENTS

CN          101309081 A      11/2008

OTHER PUBLICATIONS

Abramovitch, Daniel, et al., "Phase-Locked Loops: A Control Centric Tutorial", To appear in the Proceedings of the 2002 ACC, 15 pages.

(Continued)

*Primary Examiner* — Adam Houston
(74) *Attorney, Agent, or Firm* — Blakely Sokoloff Taylor & Zafman LLP (57) ABSTRACT

The present invention relates to a method and device for phase-frequency detection in a phase-lock loop circuit. The method comprises receiving compare edge of a reference clock signal and compare edge of a feedback clock signal, maintaining a phase/frequency detector, PFD, state machine with three PFD states, UP, DOWN, and IDLE, based on the received compare edges of the reference and feedback clock signals, recording current and previous time the state machine stays in UP or DOWN states, generating an UP or DOWN signal based on transition of PFD states and the comparison between recorded current time and recorded previous time; and outputting a digital control signal to a feedback frequency control device based on the UP or DOWN signal. A device and system is arranged to execute the method according to the present invention.

20 Claims, 5 Drawing Sheets

(56) References Cited

OTHER PUBLICATIONS

Gardne, Floyd M., "Charge-Pump Phase-Lock Loops", IEEE Transactions on Communications, vol. COM-28, No. 11, Nov. 1980, 10 pages.

International Preliminary Report on Patentability, Application No. PCT/CN2010/002190, Jul. 2, 2013, 5 pages.
International Search Report, Application No. PCT/CN2010/002190, dated Sep. 15, 2011, 2 pages.

* cited by examiner

PHASE-FREQUENCY DETECTION METHOD

CROSS-REFERENCE TO RELATED APPLICATIONS

This application is a National stage of International Application No. PCT/CN2010/002190, filed Dec. 29, 2010, which is hereby incorporated by reference.

TECHNICAL FIELD

The present invention relates to a method and device for phase-frequency detection in a phase-lock loop circuit.

BACKGROUND

In communication technology where different coding schemes are used it is important to synchronize communication data with a decoder in order to extract useful data. One of the components that are part of this synchronization process is a phase-lock loop (PLL) circuit.

For example, in telecommunication, the phase-Lock Loop (PLL) is used to generate clocks that have fixed phase/frequency relationship with the input reference clock. A typical PLL system is a negative control system comprising a Phase Frequency Detector (PFD), a voltage control oscillator (VCO) and a feedback path. The PFD detects the frequency and phase error between the input reference clock and the feedback clock. Then the error signal will be used to adjust the VCO so that the phase/frequency of the output/feedback clock will be suitably close to the reference clock, which is said to then lock to the reference clock.

In many applications a charge pump Phase-lock loop (PLL) circuit is used. The charge pump PLL comprises a Phase-Frequency Detector (PFD), a Charge Pump, a Loop Filter and a Voltage Control Oscillator (VCO). The widely used PFD in charge pump PLL comprise a comparison between the reference clock and a feedback clock where UP or DOWN signals are generated in the comparison and used to provide output control signal to VCO in order to increase/reduce the frequency of the output of the VCO, which in turn is the feedback clock.

A phase-locked loop solution based on a charge-pump is for instance described in "Charge-Pump Phase-Lock Loops" in IEEE Transactions on Communications, vol. com-28, no. 11, November 1980 and a general description of phase-locked loops may be found in "Phase-Locked Loops: A Control Centric Tutorial" from the Proceedings of the 2002 ACC. These may provide a basic understanding of PLL circuits and their applications.

The typical phase frequency detector has some drawbacks, such as:
1. The output control signals are essentially analogue signals, which can not be used in all-digital PLLs;
2. Given a constant frequency error between the reference clock and the feedback clock, the error signal produced by the PFD is not constant for each phase/frequency comparison, but time-varying. It will result in an inconstant frequency change rate during turning the VCO;
3. The PFD has an over-control problem which may cause the feedback clock to oscillate around the reference clock in a large scale;

In the typical PFD, a UP signal will increase the frequency of the VCO, and a DOWN signal will decrease the frequency VCO. Exemplifying the over-control problem, assuming at the beginning, the frequency of the reference clock is smaller than the frequency of the feedback clock: the PFD generates a DOWN signal to reduce the frequency of the feedback clock. After a certain time, the frequency of the reference clock will become larger than the feedback clock. However, the PFD has a hysteresis effect in that the down signal can not immediately be reduced to zero, but slowly become narrower and narrower and finally disappears. The redundant down signal will cause over reduction of the frequency of the feedback clock, and cause a feedback clock oscillation. Similarly, if the frequency of the reference clock is larger than the frequency of the feedback clock at the beginning, the UP signal will act with the same behaviour as the above described DOWN signal.

SUMMARY

It is therefore an object to provide a method and circuit for fast convergence of a feedback clock signal to a reference clock signal in a phase locked loop circuit and with a reduced over-control problem.

A basic characteristic of the control signal in an over control area is that its signal width become narrower and narrower; hence by tuning a feedback clock signal, e.g. using a voltage controlled oscillator (VCO), in an opposite direction indicated by the UP/DOWN signal when the current UP/DOWN signal is narrower than the previous UP/DOWN signal, fast convergence may be provided. Thus the over-control problem is addressed in such a manner as to reduce the over-control problem due to the fast convergence.

This is provided in a number of embodiments in which a first is a method for detecting phase/frequency error in a digital phase-locked loop, PLL. The method comprises receiving a compare edge of a reference clock signal, a compare edge of a feedback clock signal, and maintaining a phase/frequency detector, PFD, state machine with three PFD states, UP, DOWN, and IDLE, based on the received compare edges of the reference and feedback clock signals. The method further comprises recording current and previous time the state machine stays in UP or DOWN states, generating an UP or DOWN signal based on transition of PFD states and the comparison between recorded current time and recorded previous time, and outputting a digital control signal to a feedback frequency control device based on the UP or DOWN signal.

By recording current and previous time the state machine stays in UP or DOWN states for instance by using current UP time counter, previous UP time counter, current DOWN time counter and previous DOWN time counter it is possible to quickly determine that the PLL is locked and thus fast convergence is provided.

Furthermore, another embodiment of the present invention is provided, a phase-frequency detector, i.e. PFD. The PFD comprises a phase-frequency detection, i.e. PFD, state machine arranged to receive compare edges of the reference and feedback clock signals and maintain the PFD state machine in three PFD states, UP, DOWN, and IDLE, based on the compare edges of reference and feedback clock signals.

The PFD is arranged to record current and previous time the state machine stays in UP or DOWN states, generate an UP or DOWN signal based on transition of PFD states and the comparison between recorded current time and recorded previous time, and output a digital control signal to a feedback frequency control device based on the UP or DOWN signal.

The detector further comprises an UP gain counter and a DOWN gain counter receiving the UP and DOWN signals; the gain counter provide an advantage of controlling the sensitivity of the PFD and provide a constant gain of each phase-frequency comparison.

Yet another embodiment of the present invention is provided, a digital phase locked loop, i.e. PLL, circuit. The PLL comprises a reference clock signal divider receiving a reference clock signal and outputting a compare edge of a divided clock signal, a feedback clock signal divider receiving a feedback clock signal and outputting a compare edge of a divided clock signal, a phase/frequency detector, i.e. PFD, receiving compare edges of the divided reference and feedback clock signals and arranged to output a digital control signal related to a phase/frequency error, and a feedback frequency control device arranged to receive the digital control signal related to the phase/frequency error from the PFD and to control a frequency of the feedback clock signal.

The PFD is arranged to receive the compare edge of the reference clock signal, receive the compare edge of the feedback clock signal, maintain a PFD state machine in three PFD states, UP, DOWN, and IDLE, based on the compare edges of the reference and feedback clock signals, record current and previous time the state machine stays in UP or DOWN states, generate an UP or DOWN signal based on transition of PFD states and the comparison between recorded current time and recorded previous time, and output the digital control signal to the feedback frequency control device based on the UP or DOWN signal.

Embodiments advantageously provide applicability for digital PLL circuits, such as all-digital PLL circuits and hybrid PLL circuits, and addresses the over control problem in typical PFD, and provide a constant gain of each phase-frequency comparison.

BRIEF DESCRIPTION OF THE DRAWINGS

In the following the invention will be described in a non-limiting way and in more detail with reference to exemplary embodiments illustrated in the enclosed drawings, in which.

The drawings are not necessarily to scale; emphasis is instead being placed upon illustrating the principle of the present idea.

DETAILED DESCRIPTION

Figure 1:
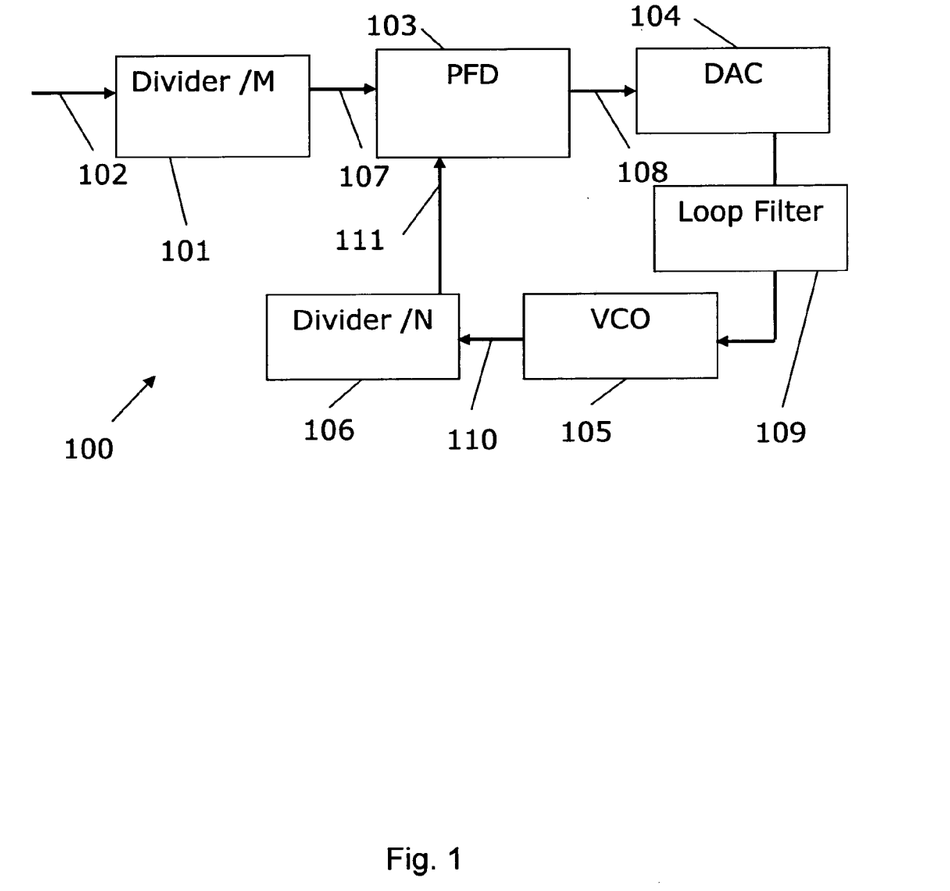
FIG. 1 illustrates schematically a phase-locked loop device according to the present invention.

A digital Phase-Locked Loop (PLL) or hybrid PLL circuit 100 according to the present invention is shown in FIG. 1. The PLL comprise a reference clock input 102 and a feedback clock input 110 each into a respective divider: divider /M 101 and Divider /N 106. Each divider comprise an output coupling 107, 111, connected to a phase frequency detector (PFD) 103. The dividers are arranged to divide the clock reference and feedback clocks so that the divided clocks have substantially the same frequency. It should be noted that the dividers can be optional, depending on the requirement in practice. The PFD is arranged to detect phase and/or frequency differences between the reference clock and the feedback clock. The PFD in turn outputs 108 a digital control signal to control the phase/frequency of the feedback control signal, e.g. by providing the digital control signal to a digital to analogue converter (DAC) 104 since the PFD operates in the digital domain; however, if all components are digital the DAC is not used. A loop filter 109 may optionally be arranged to receive an analogue control signal from the DAC in order to filter the signal and provide an optimized signal to a feedback frequency control device, e.g. a voltage controlled oscillator (VCO) 105; the loop filter may for instance be a low pass filter or gain filter and may be used for determining the time characteristics of the PLL circuit, provide stability by removing spurious signals, such as ripple, and so on. The VCO outputs a feedback signal with frequency/phase depending on the voltage control signal. The feedback signal is used in the feedback loop into the PFD via the divider /N and possibly also as part of an application (not shown) for where the PLL is used. It should be noted that DAC 104 can be optional, depending on the requirement in practice.

For example, the DAC is not needed for a phase locked loop circuit with a digitally controlled oscillator, where the loop filter may also be a digital filter.

The main difference between an analogue PLL and the digital PLL is that the PFD of the digital PLL produces an error signal and outputs a control signal in a digital manner, hence a digital to analogue converter (DAC) may be needed to convert the digital control signal to an analogue control signal if a voltage controlled oscillator is used for controlling the frequency of the feedback clock signal.

Figure 2:
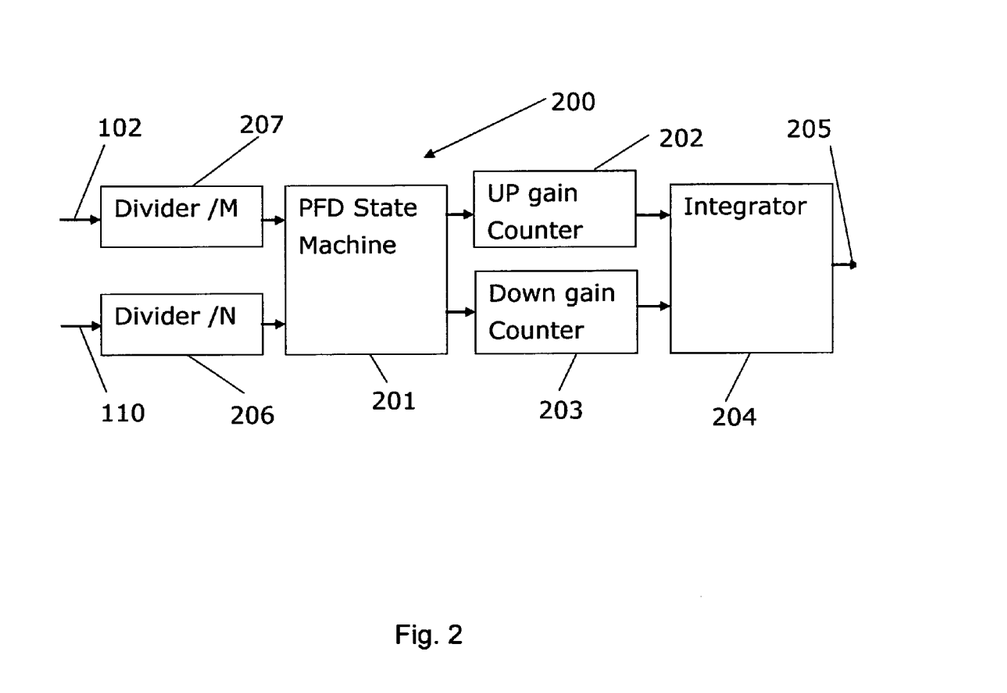
FIG. 2 illustrates schematically a phase/frequency detector device according to the present invention.

The divider logic and the PFD logic are driven by a high frequency system clock with a frequency much larger than the frequency of the reference and feedback clocks, e.g. a factor of two, five, or ten larger. The PFD 200 is shown in FIG. 2, wherein the first clock divider 207, the second clock divider 206 and the PFD are put together to provide the digital control signal to control the VCO; however it should be noted that the dividers 207 and 206 may optionally be provided separately outside of the PFD 200. Each divider /M 207 and /N 206 respectively receive the reference clock 102 and feedback clock 111 and outputs a signal relevant to the frequency into a PFD state machine 201 and produce compare edges of the reference and feedback clock signals as will be discussed later in this document. Optionally, each of the dividers 207 and 206 can include a divider state machine which is used to reduce an initial phase/frequency error. The PFD state machine will be discussed in more detail later in this document; however, the PFD state machine in turn provides signals indicating if the VCO frequency is to be increased or decreased by providing UP or DOWN signals. Optionally, an UP gain counter 202 and a DOWN gain counter 203 can be used to adjust the gain for each UP or DOWN signal. Further, an integrator 204 may be provided after the UP and DOWN gain counters and the integrator provides the feedback frequency control signal as an integrated signal 205 to the DAC 104; it should be noted that the PLL may operate without UP/DOWN gain counters. If there is no UP/DOWN gain counters, each UP and DOWN signal will be directly integrated.

Figure 3:
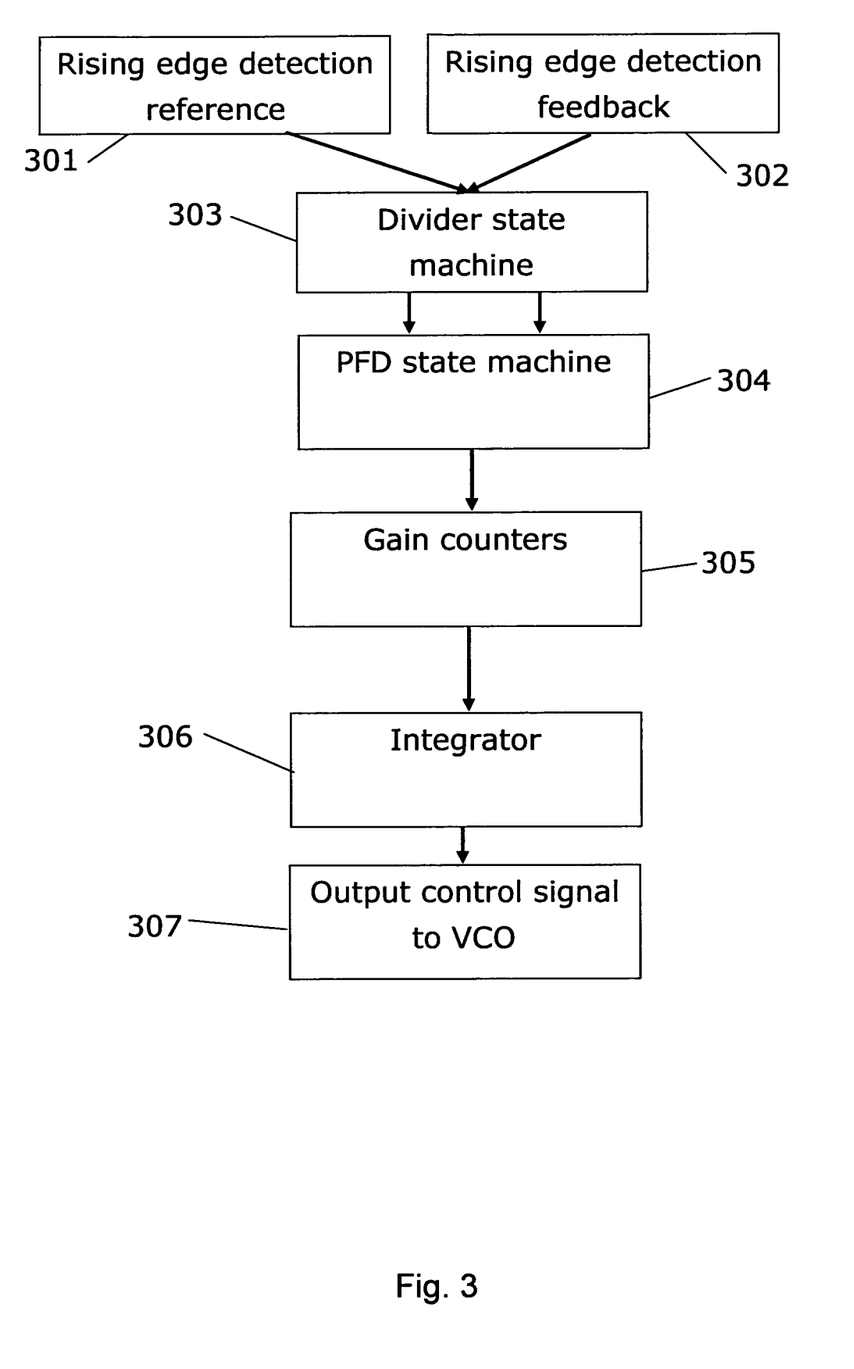
FIG. 3 illustrates schematically a method according to the present invention.

The operation of the divider/PFD logic will now be discussed in more detail, which first is summarized in relation to FIG. 3:

301. Rising edge is detected for the reference clock signal; optionally the clock signal is divided.

302. Rising edge is detected for the feedback clock signal; optionally the clock signal is divided.

303. Information about the respective rising edge may optionally be used to set a state in a divider state machine of the clock divider to reduce an initial phase/frequency error. The clock divider produce a compare edge of the reference clock signal or feedback clock signal based on the rising edge of the reference clock signal or feedback clock signal. For example, a clock divider/M can produce a compare edge of the reference clock signal every M rising edges of the reference clock signal, and a clock divider/N can produce a compare edge of the feedback clock signal every N rising edges of the feedback clock signal. The compare edge can be regarded as the rising or falling edge of the divided clock signal.

304. Compare edges of the reference clock signal and the feedback clock signal are received by PDF and are used for maintaining a PFD state machine for determining if UP or DOWN signal is to be generated for adjusting the feedback frequency;

305. An UP gain counter and a DOWN gain counter (UP/DOWN gain counters) may optionally be updated in relation to each of the UP or DOWN signal generated by the PFD state machine;

306. Signals from the gain counters are integrated before being output to the a feedback frequency control device, e.g. VCO;

307. Outputting a digital control signal related to the integration 306 to the feedback frequency control device, e.g. the VCO.

The above method summary has been exemplified with detection of rising edges of the feedback and reference clock signals to produce the compare edges; however, it should be noted that detection of falling edges or a combination of rising and falling edges may be used instead; this will be indicated below.

The clock divider can produce the compare edges with their initial phase minimized. Let us take using rising edge of the reference and feedback clock to produce the compare edge as an example: the reference/feedback clock signal will be sampled by the system clock which has a much higher frequency. The reference/feedback clock signal will be registered for two stages to remove any meta-stability effects and then the sampled clock signal will be delayed for one more system clock cycle to detect each rising edge of the reference and feedback clock signals; i.e. a rising edge is detected when the two-cycle delayed signal equals to a logic one and the three-cycle signal equal to a logic zero. Both the reference clock signal and the feedback clock signal has a divider counter, in which a maximum count value may be programmed and predefined. The divider counter will increase by one on detecting each clock signal rising edge. On every rising edge with divider counter value is zero, the compare edge is generated. The count value warps to zero when it reaches the predefined maximum count value; the maximum count value may be of any value of interest such as for instance 2, 4, 6, 10, 11, or even higher such as 256. Hence, different divider ratio may be achieved by setting different maximum count values. Alternatively, falling edge of the reference and feedback clock may be used to produce the compare edge in a similar process.

Figure 4:
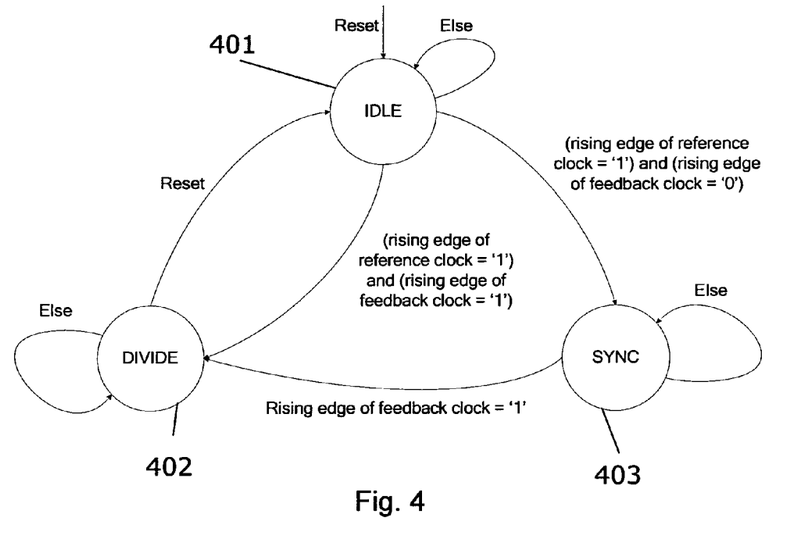
FIG. 4 illustrates schematically a divider state machine according to the present invention.

After reset, the PLL will try to reduce frequency/phase error based on an initial detected phase error, i.e. a difference between the first compare edge of the reference clock signal and the first compare edge of the feedback clock signal. However, when the first compare edge of reference clock signal lags the first compare edge of feedback clock signal, but the frequency of the reference clock signal is larger than the feedback clock signal, or when the first compare edge of feedback clock signal lags the first compare edge of reference clock signal, but the frequency of the feedback clock signal is larger than the reference clock signal, the initial adjustment is opposite to reduce the frequency/phase error. Hence it will increase the lock time if the initial phase error is large. In order to minimize the initial phase error a divider state machine is utilized which comprise three different PFD states: IDLE 401, DIVIDE 402, and SYNC 403. For instance, after reset, the state machine will enter an IDLE state, then if the rising edge of the reference clock and the feedback clock signals appears at the same time the divider will utilize the divider state machine and leave an IDLE state and enter a DIVIDE state 402, and start both the reference and feedback divider counters at the same time. Otherwise, the divider will find a rising edge of reference clock signal and enters a SYNC state. In the SYNC state, only the divider counter for reference clock signal will be started. The divider will finally enter DIVIDE mode if a rising edge of the feedback clock is found. At the same time the divider counter for feedback clock signal will be started. Both of the divider counters will free run and generate compare edges in DIVIDE state. Furthermore, if the system is reset, the IDLE state is entered. Also it should be noted that falling edges of the reference and feedback clock signals may be used instead of rising edges in a similar manner.

FIG. 4 may be summarized in the following table, table 1:

TABLE 1

| From state | To state | | |
|---|---|---|---|
| | IDLE | DIVIDE | SYNC |
| IDLE | Else stay in state | (rising edge of reference clock = 1) and (rising edge of feedback clock = 1) | (rising edge of reference clock = 1) and (rising edge of feedback clock = 0) |
| DIVIDE | reset | Else stay in state | |
| SYNC | | (rising edge of feedback clock = 1) | Else stay in state |

Reducing the initial phase error is performed for example by first detecting a reference clock signal rising edge as a first reference clock signal compare edge and then detecting a rising edge of the feedback clock signal that is adjacent to the first reference clock signal compare edge and determine that as a first compare edge of the feedback clock signal; in this manner the first compare edges of the reference and feedback clock signals are kept as close as possible. It should be noted that alternatively a rising edge of the feedback clock signal may be detected first and then a rising edge of the reference clock signal.

Figure 5:
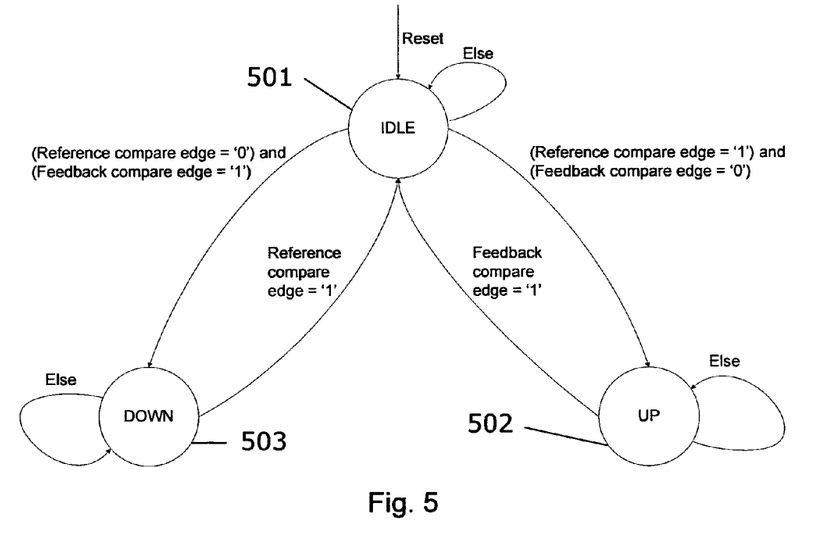
FIG. 5 illustrates schematically a phase/frequency detector state machine according to the present invention.

The phase frequency detector (PFD) also has a state machine, as illustrated in FIG. 5, where the PFD state machine has three states: IDLE 501, UP 502, and DOWN 503. After reset the PFD state machine enters an IDLE state and if a feedback compare edge, i.e. compare edge of the feedback clock signal, is detected while a reference compare edge, i.e. compare edge of the reference clock signal, is not detected, the PFD state machine enters/transits into a DOWN state or if a reference compare edge is detected but no feedback compare edge is detected the PFD state machine enters into an UP state. Based on the state machine, a cycle slip may easily be detected: a cycle slip happens when a reference compare edge appears when the PFD state machine is in the UP state or a feedback compare edge appears when the PFD state machine is in the DOWN state.

FIG. 5 may be summarized in the following table: table 2:

TABLE 2

| From state | To state | | |
|---|---|---|---|
| | IDLE | DOWN | UP |
| IDLE | Else stay in state | (reference compare edge = 0) and (feedback compare edge = 1) | (reference compare edge = 1) and (feedback compare edge = 0) |
| DOWN | (reference compare edge = 1) | Else stay in state | |
| UP | (feedback compare edge = 1) | | Else stay in state |

Four counters are maintained in relation to the PFD state machine:

Current UP time counter: records how long the state machine stays in UP state. This counter will be cleared when the state machine returns to IDLE state or when a cycle slip happens in UP state. Otherwise, it increases by 1 on each system clock cycle in UP state.

Previous UP time counter: records how long the state machine stays in UP states in previous time. It will be always cleared when the state machine enters DOWN state. It will also be cleared when a cycle slip happens in UP state. The previous UP time counter will get a value from current UP time counter on the transition from UP state to IDLE state.

Current DOWN time counter: records how long the state machine stays in DOWN state. This counter will be cleared when the state machine returns to IDLE state or when a cycle slip happens in DOWN state. Otherwise, it increases by 1 on each system clock cycle in DOWN state.

Previous DOWN time counter: records how long the state machine stays in DOWN states in previous time. It will be always cleared when the state machine enters UP state. It will also be cleared when a cycle slip happens in the DOWN state. The previous DOWN time counter will get a value from the current DOWN time counter on the transition from DOWN state to IDLE state.

An UP/DOWN signal will possibly be generated on transition from UP or DOWN to IDLE state depending on the relationship between current DOWN/UP and previous DOWN/UP time counter. The UP and DOWN generation criterion with support for phase detection may be described with a logical scheme and an UP signal generation may be determined from:

```
if (transition from UP to IDLE) then
    if (current UP time counter < previous UP time counter) then
        UP = '0';
    else
        UP = '1';
    end if;
else if (transition from DOWN to IDLE) then
    if (current DOWN time counter < previous DOWN time counter) then
        UP = '1';
    else
        UP = '0';
    end if;
else
    UP = '0';
end if;
```

Similarly, the DOWN signal may be generated as:

```
if (transition from DOWN to IDLE) then
    if (current DOWN time counter < previous DOWN time counter) then
        DOWN = '0';
    else
        DOWN = '1';
    end if;
else if (transition from UP to IDLE) then
    if (current UP time counter < previous UP time counter) then
        DOWN = '1';
    else
        DOWN = '0';
    end if;
else
    DOWN = '0';
end if;
```

An UP/DOWN gain counter is preferably a binary counter which increases by 1 on each UP/DOWN signal which may be useful to use in order to reduce sensitivity of the feedback loop. On every overflow of the UP/DOWN gain counter, an integrator will increase/reduce by 1; the maximum count value of the gain counter may be adjusted to any suitable number. It should be noted that the UP/DOWN gain counters may be provided in the PFD 200. The usefulness of the gain counters may be illustrated for instance by considering if there is no gain counter, then each UP and DOWN signal will be directly integrated; for example, if there are 100 UP pulses, the voltage of the VCO will increase 100 steps, however, if there is an UP gain counter with a overflow value of 100, the voltage of the VCO will only increase 1 step. An N bit counter can reduce the gain for each UP/DOWN signal by:

$$\frac{1}{2^N}$$

The integrator is also preferably a binary counter, which responds to each overflow of the UP/DOWN gain counter. An overflow on the UP gain counter will increase the integrator by 1, and an overflow on the DOWN gain counter will decrease the integrator by 1. The integrator does not warp to zero when it reaches its maximum value, i.e. does not overflow, and the integrator does not warp to maximum value when it reaches zero, i.e. does not underflow. The initial value of the integrator may be programmable so that the initial frequency of feedback clock can be set to close to the reference clock, which will reduce the PLL lock time.

The PLL is regarded as locked when several continuous phase errors between the reference clock and the feedback clock signals are all smaller than a threshold value. In this embodiment, a lock detector maintains a binary lock counter. The binary lock counter is cleared when either current UP time counter or current DOWN time counter is larger than a predefined threshold value which indicates the maximum allowable phase error in lock state. Otherwise, the binary lock counter will increment on every reference compare edge. When the binary lock counter value is larger than a predefined threshold value a lock signal is generated. The binary lock counter does not warp to zero when it reaches the maximum threshold value.

Figure 6:
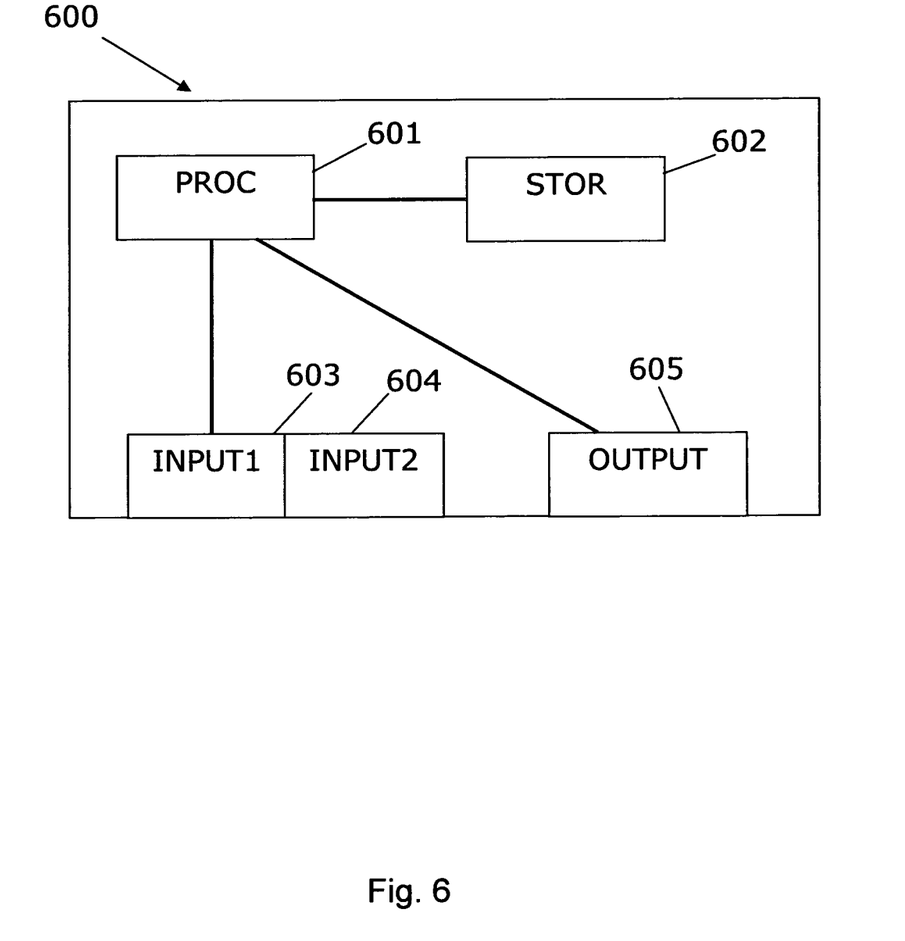
FIG. 6 illustrates schematically a device according to the present invention.

In one embodiment of the PFD 200 may be provided in a processing device 600 as illustrated in FIG. 6 and the processing device 600 comprises at least one processing unit 601, at least one computer readable storage unit 602, at least one input 603 and 604, and at least one output 605. The processing unit is arranged to execute the operation of the PFD, e.g. in software or hardware instruction sets. The processing unit may comprise a microprocessor, a digital signal processor (DSP), or application specific integrated circuit (ASIC). Other embodiments may comprise gate logic circuits, for instance in a field programmable gate array (FPGA), or in discrete components, such as logical circuits. The computer readable storage unit may comprise any type of suitable volatile and/or non-volatile memory. It should be noted that all components of the PFD may be fitted into one processing device 600, for instance the components shown in FIG. 2, or only parts of the PFD, e.g. the PFD state machine 201 or the PFD state machine 201 and dividers 101 and 106, or other combinations of the components shown in FIG. 2.

It should be noted that the word "comprising" does not exclude the presence of other elements or steps than those listed and the words "a" or "an" preceding an element do not exclude the presence of a plurality of such elements. It should further be noted that any reference signs do not limit the scope of the claims, that the invention may be at least in part implemented by means of both hardware and software, and that several "means" or "units" may be represented by the same item of hardware.

The above mentioned and described embodiments are only given as examples and should not be limiting to the present invention. Other solutions, uses, objectives, and functions within the scope of the invention as claimed in the below described patent claims should be apparent for the person skilled in the art.

The invention claimed is:

1. A method for detecting phase/frequency error in a digital phase-locked loop (PLL) comprising:
    receiving compare edge of a reference clock signal and compare edge of a feedback clock signal;
    maintaining a phase/frequency detector,(PFD) state machine with three PFD states, UP, DOWN, and IDLE, based on the received compare edges of the reference and feedback clock signals;
    recording current and previous time the PFD state machine stays in UP or DOWN states;
    generating an UP or DOWN signal based on transition of PFD states and a comparison between recorded current time and recorded previous time; and
    outputting a digital control signal to a feedback frequency control device based on the UP or DOWN signal.

2. The method according to claim 1, wherein recording current and previous time the PFD state machine stays in UP or DOWN states is performed by using a current UP time counter, a previous UP time counter, a current DOWN time counter, and a previous DOWN time counter.

3. The method according to claim 2, wherein generating an UP or DOWN signal based on the recorded current and previous time comprises:
    generating an UP signal if the current UP time counter is no less than the previous UP time counter when transition from UP state to IDLE state, or if the current DOWN time counter is smaller than the previous DOWN time counter when transition from DOWN state to IDLE state; and
    generating an DOWN signal if the current DOWN time counter is no less than the previous DOWN time counter when transition from DOWN state to IDLE state, or if the current UP time counter is smaller than the previous UP time counter when transition from UP state to IDLE state.

4. The method according to claim 1, wherein maintaining the PFD state machine comprises:
    transiting PFD state machine state from IDLE to UP when a compare edge of the reference clock signal is detected while no compare edge of the feedback clock signal is detected in IDLE state;
    transiting PFD state machine state from UP to IDLE when a compare edge of the feedback clock signal is detected in UP state;
    transiting PFD state machine state from IDLE to DOWN when a compare edge of the feedback clock signal is detected while no compare edge of the reference clock signal is detected in IDLE state; and
    transiting PFD state machine state from DOWN to IDLE when a compare edge of the reference clock signal is detected in DOWN state.

5. The method according to claim 1, further comprising using a divider state machine to reduce an initial phase error of the compare edges of the reference and feedback clock signals.

6. The method according to claim 5, wherein using the divider state machine to reduce the initial phase error of the compare edges of the reference and feedback clock signals comprises:
    setting the divider state machine into one of three states: IDLE, SYNC, and DIVIDE; and
    finding a first compare edge of the feedback clock signal adjacent to a first compare edge of reference clock signal.

7. The method according to claim 1, further comprising updating an UP gain counter and a DOWN gain counter based on the UP or DOWN signal.

8. The method according to claim 7, further comprising updating an integrator by detecting overflow of the UP gain counter and the DOWN gain counter.

9. The method according to claim 1, further comprising detecting a cycle slip between the reference and feedback clock signals, wherein the cycle slip is detected if a compare edge of the reference clock signal appears in the UP state, or if a compare edge of the feedback clock signal appears in the DOWN state.

10. The method according to claim 1, wherein the compare edges may be generated based on either rising edge of the reference/feedback clock signal or falling edge of the reference/feedback clock signal.

11. A phase/frequency detector (PFD), comprising:
    a phase/frequency detector state machine arranged to receive compare edges of the reference and feedback clock signals, wherein the PFD state machine is further arranged to maintain in three PFD states, UP, DOWN, and IDLE, based on the compare edges of the reference and feedback clock signals;
    and wherein the PFD is arranged to:
    record current and previous time the PFD state machine stays in UP or DOWN states;
    generate an UP or DOWN signal based on transition of PFD states and the comparison between recorded current time and recorded previous time; and
    output a digital control signal to a feedback frequency control device based on the UP or DOWN signal.

12. The phase/frequency detector according to claim 11, further comprising an UP gain counter and a DOWN gain counter receiving the UP and DOWN signals respectively.

13. The phase/frequency detector according to claim 12, further comprising an integrator receiving overflow signals from one of the UP or DOWN gain counters and arranged to output a digital control signal to a feedback frequency control device.

14. The phase/frequency detector according to claim 11, further comprising:
- a first clock divider arranged to receive the reference clock signal and provide the compare edge of the reference clock signal; and
- a second clock divider arranged to receive the feedback clock signal and provide the compare edge of the feedback clock signal;
- wherein each of the first clock divider and the second clock divider include a divider state machine to reduce an initial phase error of the compare edges.

15. The phase/frequency detector according to claim 11, further comprising a current UP time counter, a previous UP time counter, a current DOWN time counter, and a previous DOWN time counter being used for recording current and previous time that the phase/frequency detector state machine stays in UP or DOWN states.

16. The phase/frequency detector according to claim 15, wherein generating an UP or DOWN signal based on the recorded current and previous time comprises:
- generating an UP signal if the current UP time counter is no less than the previous UP time counter when transition from UP state to IDLE state, or if the current DOWN time counter is smaller than the previous DOWN time counter when transition from DOWN state to IDLE state; and
- generating an DOWN signal if the current DOWN time counter is no less than the previous DOWN time counter when transition from DOWN state to IDLE state, or if the current UP time counter is smaller than the previous UP time counter when transition from UP state to IDLE state.

17. The phase/frequency detector according to claim 11, wherein maintaining the PFD state machine comprises:
- transiting PFD state machine state from IDLE to UP when a compare edge of the reference clock signal is detected while no compare edge of the feedback clock signal is detected in IDLE state;
- transiting PFD state machine state from UP to IDLE when a compare edge of the feedback clock signal is detected in UP state;
- transiting PFD state machine state from IDLE to DOWN when a compare edge of the feedback clock signal is detected while no compare edge of the reference clock signal is detected in IDLE state; and
- transiting PFD state machine state from DOWN to IDLE when a compare edge of the reference clock signal is detected in DOWN state.

18. The phase/frequency detector according to claim 11, wherein the compare edges may be generated based on either rising edge of the reference/feedback clock signal or falling edge of the reference/feedback clock signal.

19. A digital phase locked loop (PLL) circuit comprising:
- a reference clock signal divider receiving a reference clock signal and outputting a compare edge of the reference clock signal;
- a feedback clock signal divider receiving a feedback clock signal and outputting a compare edge of the feedback clock signal;
- a phase/frequency detector (PFD), receiving the compare edges of the reference and feedback clock signals and arranged to output a digital control signal related to a phase/frequency error; and
- a feedback frequency control device arranged to receive the digital control signal related to a phase/frequency error from the PFD and to control a frequency of the feedback clock signal;

wherein the PFD is arranged to:
receive the compare edge of the reference clock signal;
receive the compare edge of the feedback clock signal;
maintain a (PFD) state machine in three PFD states, UP, DOWN, and IDLE, based on the compare edges of the reference and feedback clock signals;
record current and previous time the state machine stays in UP or DOWN states;
generate an UP or DOWN signal based on transition of PFD states and the comparison between recorded current time and recorded previous time; and
output the digital control signal to the feedback frequency control device based on the UP or DOWN signal.

20. The digital phase locked loop circuit according to claim 19, wherein the PLL is one of an all-digital PLL or a hybrid PLL.

* * * * *

UNITED STATES PATENT AND TRADEMARK OFFICE
CERTIFICATE OF CORRECTION

| | | |
|---|---|---|
| PATENT NO. | : 8,766,689 B2 | Page 1 of 1 |
| APPLICATION NO. | : 13/976943 | |
| DATED | : July 1, 2014 | |
| INVENTOR(S) | : Wen | |

It is certified that error appears in the above-identified patent and that said Letters Patent is hereby corrected as shown below:

In the Specification

In Column 5, Line 11, delete "PDF" and insert -- PFD --, therefor.

Signed and Sealed this
Fourth Day of November, 2014

Michelle K. Lee
*Deputy Director of the United States Patent and Trademark Office*